United States Patent
Sekiguchi et al.

(10) Patent No.: US 6,828,662 B2
(45) Date of Patent: Dec. 7, 2004

(54) SEMICONDUCTOR DEVICE

(75) Inventors: Noboru Sekiguchi, Tokyo (JP); Kazuo Murakami, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/358,321

(22) Filed: Feb. 5, 2003

(65) Prior Publication Data

US 2004/0032015 A1 Feb. 19, 2004

(30) Foreign Application Priority Data

Aug. 13, 2002 (JP) ........................................ 2002-235927

(51) Int. Cl.$^7$ ............................................ H01L 23/495
(52) U.S. Cl. ........................ 257/676; 257/666; 257/307
(58) Field of Search ................................ 257/666, 676, 257/307

(56) References Cited

U.S. PATENT DOCUMENTS 4,714,952 A  * 12/1987 Takekawa et al.
5,559,306 A  *  9/1996 Mahulikar
6,310,388 B1 * 10/2001 Bissey

FOREIGN PATENT DOCUMENTS

JP          06-077395          3/1994

* cited by examiner

Primary Examiner—S. V. Clark
(74) Attorney, Agent, or Firm—Leydig, Voit & Mayer, Ltd.

(57) ABSTRACT

A semiconductor device includes an IC chip, a frame on which the IC chip is mounted, a conductive plate disposed beneath and spaced from the frame, a first external terminal and a second external terminal that electrically connect the IC chip, the frame, and the conductive plate, and a molding compound covering and encapsulating the IC chip, the frame, and the conductive plate.

4 Claims, 6 Drawing Sheets

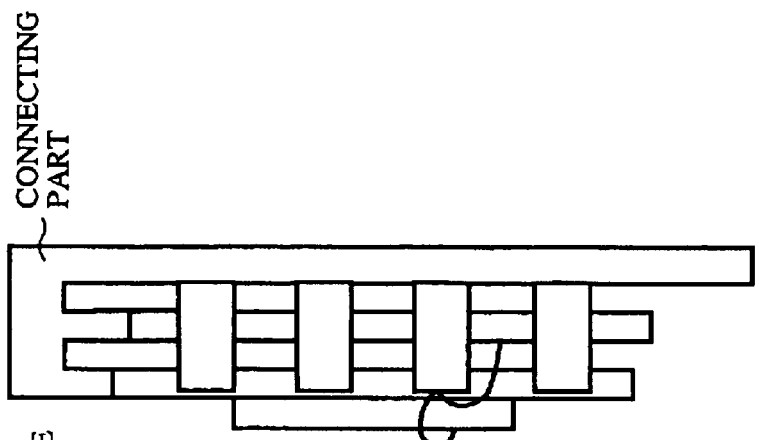
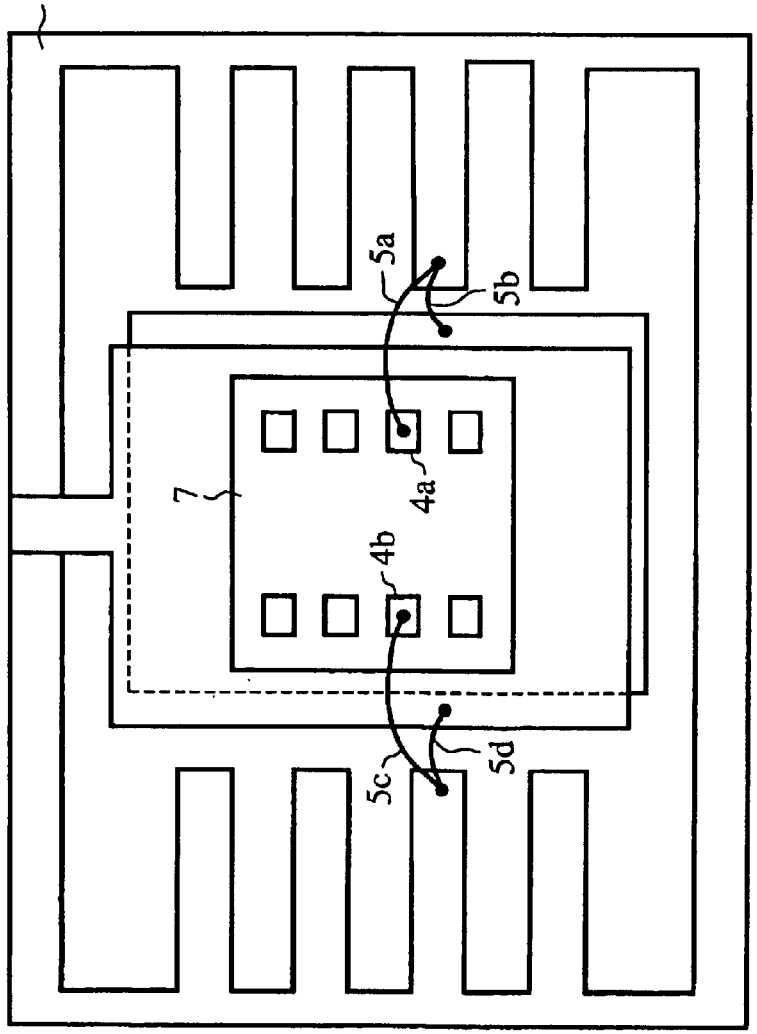
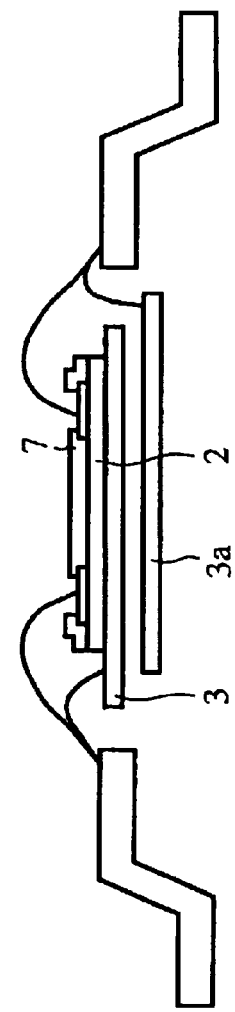
FIG.2

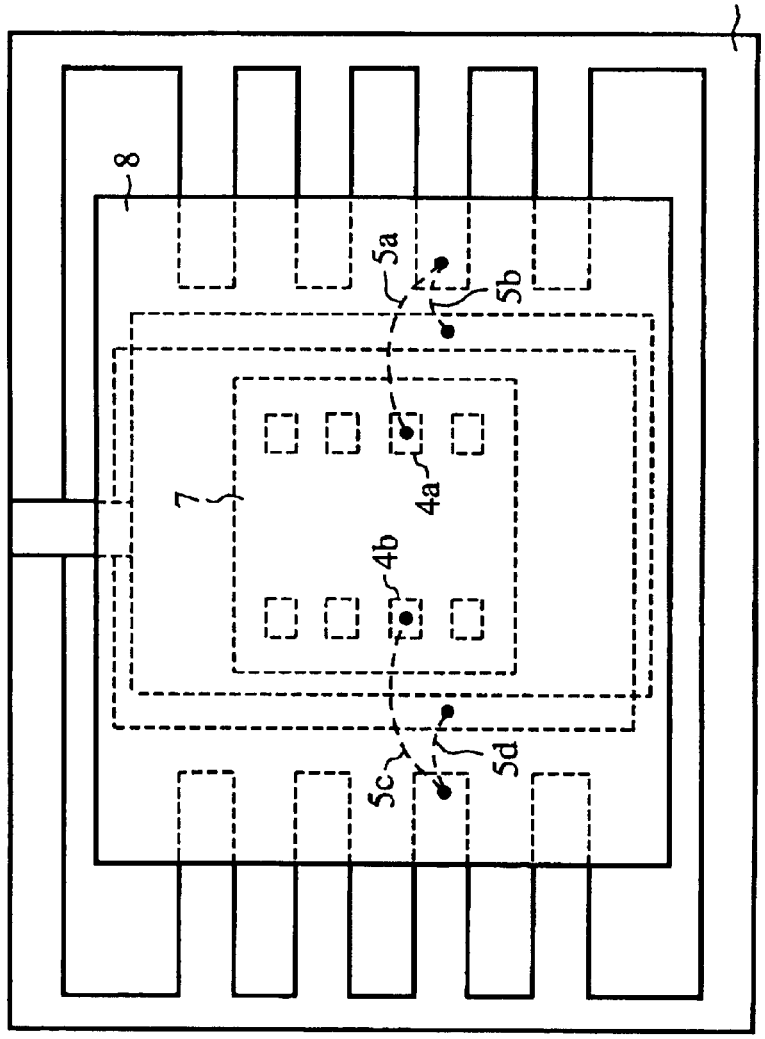
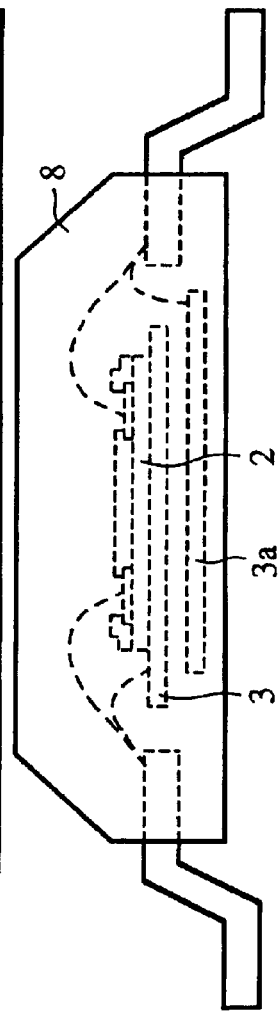
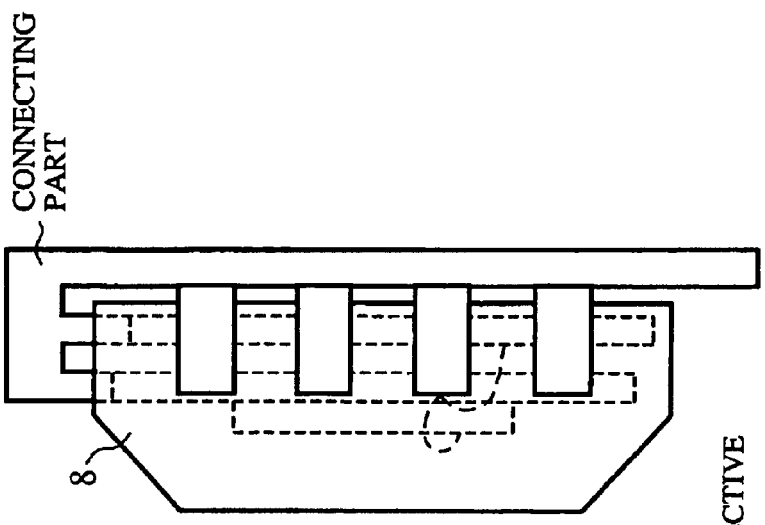
FIG.3

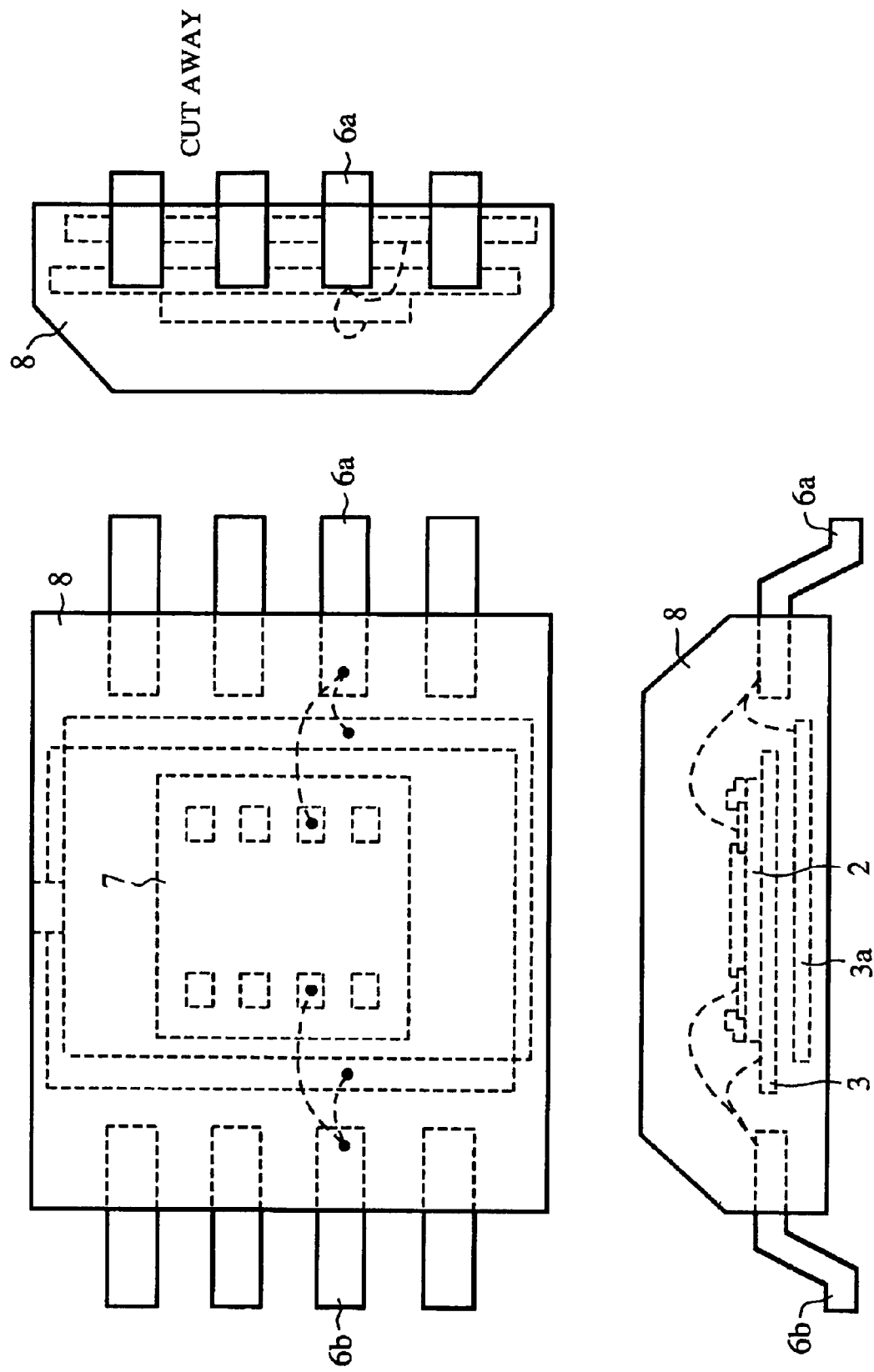

SEMICONDUCTOR DEVICE

BACKGROUND OF THE INVENTION

1. Field of the Invention

The present invention relates to a packaged semiconductor device, and more particularly to a semiconductor device that realizes downsizing and low cost even though it has a capacitance therein.

2. Description of the Related Art

FIG. 9 is a schematic sectional view explaining the structure of the conventional semiconductor device.

Referring to FIG. 9, reference numeral 51 denotes a semiconductor device, 52 denotes an IC chip (semiconductor element), 53 denotes a frame on which the IC chip 52 is mounted.

Reference numerals 54a and 54b denote pad-shaped electrodes (hereinafter referred to as pads) provided on the IC chip 52, 55a and 55b denote bonding wires (hereinafter referred to as wires), and 56a and 56b denote a first external terminal and a second external terminal. The wire 55a connects the pad 54a and the first external terminal 56a, and the wire 55b connects the pad 54b and the second external terminal 56b.

Reference numeral 57 denotes a protection film provided such that the film covers over the IC chip 52 except the top surfaces of the pad 54a and the pad 54b, 58 denotes a molding compound covering the above-mentioned portions except a part of the first external terminal 56a and the second external terminal 56b.

The conventional semiconductor device 51 thus arranged has the following problems.

Because the structure of the semiconductor device 51 is devoid of a capacitance, a capacitance is usually formed within the IC chip 52 or externally added to the semiconductor device 51 when a capacitance is used as a bypass capacitor between the power supply and the ground, or when a capacitance is needed for improving or adjusting properties of the semiconductor device when using the device as an analog element.

The method has been known in which a capacitance is formed within the IC chip 52 using the diffused layer of silicon or gate oxide film as a dielectric in the manufacturing process of the IC chip 52, for instance. Furthermore, the method has been known, to externally add a capacitor to the semiconductor device 51, which includes the capacitor and the semiconductor device 51 on the system substrate, for instance.

However, in the case where the capacitance is formed within the IC chip 52, the cost thereof increases because of the increased area of the IC chip 52. In the case where the capacitor is externally added to the semiconductor device, the method has its limits in the miniaturization and cost reduction of the electronic equipment on account of the need for a capacitive component, such as the above-mentioned capacitor.

SUMMARY OF THE INVENTION

The present invention has been made to solve the above-mentioned problems. An object of the present invention is to provide a semiconductor device which is capable of alleviating an influence upon the IC exerted by the noises and improving performances of analog elements or the like mounted within the IC, by providing a capacitance within the package.

Another object of the present invention is to provide a semiconductor device which realizes downsizing and low cost of the IC chip and the electronic device.

A semiconductor device according to the present invention, includes a semiconductor element; a frame on which the semiconductor element is mounted; a conductive plate disposed under the frame at given intervals from the frame; and a molding compound for covering and encapsulating the semiconductor element, the frame, and the conductive plate.

Therefore, according to the present invention, a capacitance is formed beneath the semiconductor element within the semiconductor device. As a result, a semiconductor device is provided which alleviates the adverse effect upon the semiconductor element exerted by the noises of the power supply without increasing the size of the conventional semiconductor device.

BRIEF DESCRIPTION OF THE DRAWINGS

FIG. 2 is a process diagram of the first step showing an example of the method of disposing the conductive plate of the semiconductor device in the predetermined position according to a first embodiment;

FIG. 3 is a process diagram of the second step showing an example of the method of disposing the conductive plate of the semiconductor device in the predetermined position according to a first embodiment;

FIG. 4 is a process diagram of the third step showing an example of the method of disposing the conductive plate of the semiconductor device in the predetermined position according to a first embodiment;

DETAILED DESCRIPTION OF THE PREFERRED EMBODIMENTS

The preferred embodiments of the present invention will now be described below with reference to the attached drawings.

First Embodiment

Figure 1:
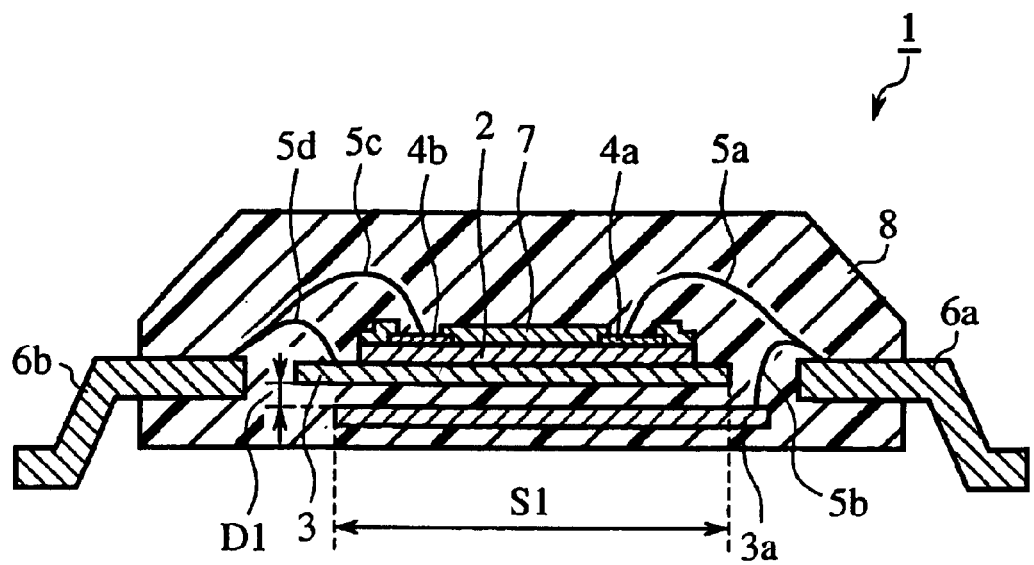
FIG. 1 is a sectional view showing the schematic configuration of the semiconductor device according to a first embodiment.

FIG. 1 is a sectional view showing the schematic configuration of the semiconductor device 1 according to the first embodiment. FIGS. 2–4 are figures showing in a stepwise manner a part of the manufacturing processes in which conductive plate 3a is disposed in parallel thereto at given intervals from frame 3 of the semiconductor device 1. FIGS. 2–4 each show a plan view, a front view, and a side view.

Referring to FIGS. 2–4, reference numeral 1 denotes the semiconductor device, 2 denotes an IC chip (semiconductor element), 3 denotes a frame consisting of a rectangular plate on which the IC chip 2 is mounted. As a material of the frame 3, there are a variety of prospective candidates satisfying the mechanical strength and corrosion resistance. For instance, alloys such as copper are a suitable one.

Reference numeral 3a denotes a conductive plate disposed in parallel thereto at given intervals from the frame 3, and made of a rectangular plate. As a material for the conductive plate 3a, alloys such as copper, for instance, are a suitable one.

Reference numerals 4a and 4b denote pad-shaped electrodes (hereinafter referred to as pads) provided on the IC chip 2, 5a–5d denote bonding wires (hereinafter referred to as wires), 6a denotes a first external terminal (external terminal), and 6b denotes a second external terminal (external terminal).

The wire 5a connects the pad 4a and the first external terminal 6a, and the wire 5b connects the conductive plate 3a and the first external terminal 6a. The wire 5c connects the pad 4b and the second external terminal 6b, and the wire 5d connects the flame 3 and the second external terminal 6b.

Reference numeral 7 denotes a protection film provided such that the film covers over the IC chips 2 except the top surfaces of the pads 4a and 4b, 8 denotes a molding compound encapsulating the IC chip 2. The molding compound covers and encapsulates all the portions designated by reference numerals 2–7, except a part of the first external terminal 6a and the second external terminal 6b.

Reference numeral D1 denotes the distance between the frame 3 and the conductive plate 3a, and S1 denotes the area at which the frame 3 opposes to the conductive plate 3a.

In the semiconductor device 1 thus arranged as above, because the portion of the molding compound 8, lying beneath the frame 3 and included in the area S1, serves as a dielectric material layer, the portions of the frame 3, the conductive plate 3a, and the dielectric material layer, lying therebetween and included in this area S1, form a capacitor. Assuming that the dielectric constant of the molding compound 8 is ρ, the capacitance value C1 is expressed by the following formula (1):

$$\text{The capacitance value } C1 = \rho \times S1/D1 \qquad (1)$$

The capacitance value C1 will serve as a bypass capacitor to reduce the noises of the power supply and as a capacitor to adjust the properties of the analog elements.

The conductive plate 3a is disposed at the predetermined position by various methods. For instance, the conductive plate 3a is disposed to form the semiconductor device 1 as follows:

1. First of all, a connective is formed, which includes the portions that will finally become the frame 3, the conductive plate 3a, the first external terminal 6a, and the second external terminal 6b, and integrates all of them into the connective. This connective is coupled by a connecting part or the like and pre-assembled such that at the time of completion of the semiconductor device each constituent element is arranged at the predetermined positions. Using the connective, the semiconductor device is built up to proceed so as to the front end process where the molding compound 8 is encapsulated using the connective (FIG. 2).
2. The portions excepting a part of the portion to be the first external terminal 6a and a part of the portion to be the second external terminal 6b are covered with the molding compound 8 and encapsulated therein (FIG. 3).
3. The frame 3, the conductive plate 3a, the first external terminal 6a and the second external terminal 6b are each isolated by cutting away the connective and excess portions. The encapsulated molding compound 8 brings the frame 3 and the conductive plate 3a into the condition in which the frame and the conductive plate are disposed to each other in parallel at given intervals (FIG. 4).

The formation of the semiconductor device 1 using the pre-assembled conductive easily provides the elaborated semiconductor device 1.

As mentioned above, according to the semiconductor device 1 of the first embodiment, since the capacitance value C1 is formed beneath the IC chip 2 within the semiconductor device 1, it reduces the adverse influence upon the semiconductor element exerted by the noises of the power supply without increasing the size of the conventional semiconductor device.

Moreover, in the process of encapsulation of the IC chip 2 using the molding compound 8, the molding compound 8 itself flowed into the narrow space between the frame 3 and the conductive plate 3a acts as a dielectric material layer and forms the capacitance value C1. Therefore, it eliminates the need for the process of forming the dielectric material layer. As a result, the formation of the capacitance value C1 can be achieved without adding a further process to the conventional semiconductor device manufacturing process.

Furthermore, since an additional preparation of the material for the dielectric material layer does not need, the reduced cost can be attained.

Second Embodiment

Figure 5:
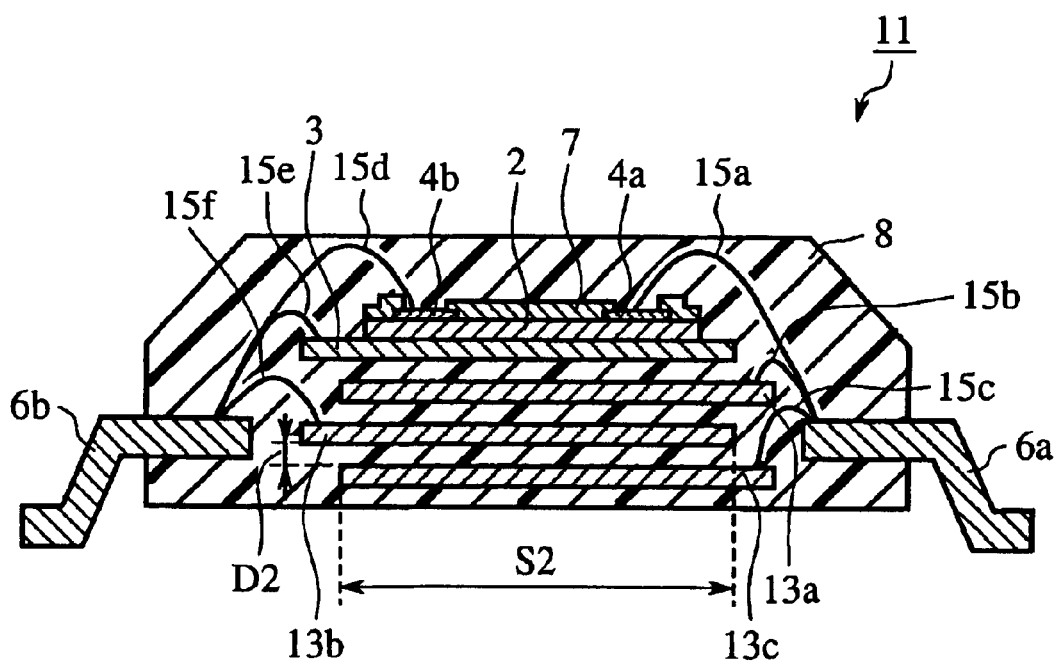
FIG. 5 is a sectional view showing the schematic configuration of the semiconductor device according to a second embodiment.

FIG. 5 is a sectional view showing the schematic configuration of the semiconductor device according to the second embodiment.

Referring to FIG. 5, reference numeral 11 denotes the semiconductor device, 13a–13c denotes flat and rectangular conductive plates that consist of three (a plurality of) plates disposed in parallel to each other at given intervals from frame 3. The conductive plates are called in order from near one close to the frame 3 as first conductive plate 13a, second conductive plate 13b, and third conductive plate 13c. The alloys of copper, for instance, are good for the materials of conductive plates 13a–13c.

Reference numerals 15a–15f denote bonding wires (hereinafter referred to as wires). The wire 15a connects pad 4a and first external terminal 6a. The wire 15b connects the first conductive plate 13a and the first external terminal 6a. The wire 15c connects the third conductive plate 13c and the first external terminal 6a. The wire 15d connects pad 4b and second external terminal 6b. The wire 15e connects the frame 3 and the second external terminal 6b. The wire 15f connects the second conductive plate 13b and the second external terminal 6b.

Reference numeral D2 denotes the distance between the conductive plates 13a–13c disposed at given intervals from the frame 3, S2 denotes an area in which the frame 3 and the first to third conductive plates 3a–3c are opposed to each other.

In the semiconductor device 11 thus arranged as above, since the portion of the molding compound 8, lying beneath the frame 3 and included in the area S2, serves as a dielectric material layer, the portions of the frame 3, the first to third conductive plates 13a–13b, and the dielectric material layers lying therebetween, included in this area S2 form a capacitor. Assuming that the number of the conductive plates is N and the dielectric constant of the molding compound 8 is ρ, the capacitance value C2 is expressed by the following formula (2):

The capacitance value $C2=(N-1)\rho \times S2/D2$ (2)

Where N=3, $C2=2\times\rho\times S2/D2$.

The capacitance of the capacitance value C2 will serve as a bypass capacitor to reduce the noises of the power supply and as a capacitor to adjust the properties of the analog elements.

The there components are the same as that of the first embodiment, and thus the detailed description thereof is omitted.

The first to third conductive plates 13a–13c are disposed at the predetermined positions by various methods. For instance, as with the first embodiment, the formation of the semiconductor device 11 using the preformed connective easily provides the elaborated semiconductor device 11.

As mentioned above, according to the semiconductor device 11 of the second embodiment, the capacitance value C2 is formed beneath the IC chip 2 within the semiconductor device 11. Moreover, in the process of encapsulation of the IC chip 2 using the molding compound 8, the capacitance value C2 is formed. A part of the molding compound 8 itself serves as a dielectric material layer. Therefore, the similar effect to that of the first embodiment is obtained.

In addition, because the semiconductor device includes a plurality of conductive plates (the first to third conductive plates 13a–13c), the capacitance value C2 of the capacitor formed within the device can be adjusted without increasing the size of the semiconductor device 11.

While in the second embodiment three conductive plates are used in the semiconductor device 11, it may be arbitrarily increased or reduced the number of the conductive plates based on the demanded capacitance value.

Third Embodiment

Figure 6:
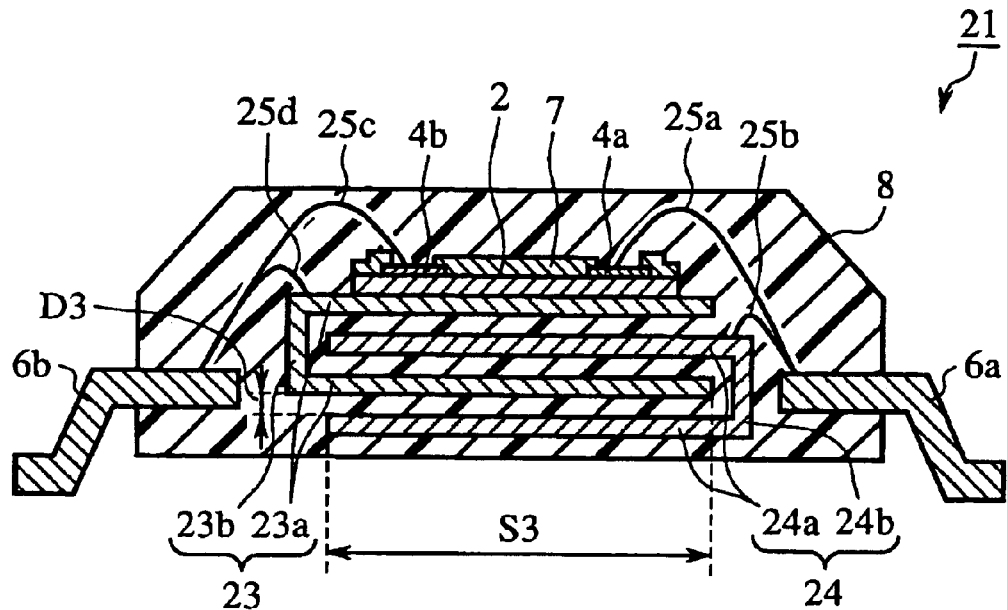
FIG. 6 is a sectional view showing the schematic configuration of the semiconductor device according to a third embodiment.

FIG. 6 is a sectional view showing the sectional configuration of the semiconductor device 21 according to the third embodiment.

Referring to FIG. 6, reference numeral 21 denotes a semiconductor device, 23 denotes a frame on which IC chip 2 is mounted. The frame 23 consists of a bent plate having a cross section in U-shape. Reference numerals 23a denote two horizontal plates out of the frame 23, 23b denotes a vertical plate out of the two horizontal plates 23a.

Reference numeral 24 denotes a conductive plate disposed at given intervals from the frame 23. The conductive plate 24 consists of a bent plate having a cross section in U-shape similar to the frame 23. Reference numerals 24a denote two horizontal plates mating the conductive plate 24, 24b denotes a vertical plate mating the two horizontal plates 24a.

These frame 23 and conductive plate 24 are arranged such that the horizontal plates 23a out of the frame 23 and the horizontal plates 24a out of the conductive plate 24 are staggered with respect to each other.

Reference numerals 25a–25d denote bonding wires (hereinafter referred to as wires). The wire 25a connects pad 4a and first external terminal 6a. The wire 25b connects the conductive plate 24 and the first external terminal 6a. The wire 25c connects pad 4b and second external terminal 6b. The wire 25d connects the frame 23 and the second external terminal 6b.

Reference numeral D3 denotes the distance between the frame 23 and the conductive plate 24. To be more accurate, reference numeral D3 denotes the distance between the horizontal plate 23a out of the frame 23 and the horizontal plate 24a out of the conductive plate 24, lying beneath the flat plate 23a. Reference numeral S3 denotes an area in which the horizontal plates 23a out of the frame 23 and the horizontal plates 24a out of the conductive plate 24 are opposed to each other.

In the semiconductor device 21 thus arranged as above, since the molding compound, lying beneath the frame 23 and included in the area S3, serves as a dielectric material layer, the portions of the frame 23, the conductive plates 24, and the dielectric material layers lying therebetween included in this area S3 form a capacitor. Assuming that the total number of the horizontal plates 23a and 24a is N and the dielectric constant of the molding compound 8 is $\rho$, the capacitance value C3 is expressed by the following formula (3):

The capacitance value $C3=(N-1)\times\rho\times S3/D3$ (3)

The capacitance value C3 will serve as a bypass capacitor to reduce the noises of the power supply and as a capacitor to adjust the properties of the analog elements.

The other components are the same as that of the first embodiment, and thus the detailed description thereof is omitted.

The conductive plate 24 is disposed at the predetermined position by various methods. For instance, as with the first embodiment, the formation of the semiconductor device 21 using the preformed connective easily provides the elaborated semiconductor device 21.

As mentioned above, according to the semiconductor device 21 of the third embodiment, the capacitance value C3 is formed beneath the IC chip 2 within the semiconductor device 21. Moreover, in the process of encapsulation of the IC chip 2 using the molding compound 8, the capacitance value C3 is formed. A part of the molding compound 8 itself serves as a dielectric material layer. Therefore, the similar effect to that of the first embodiment is obtained.

Moreover, since the frame 23 and the conductive plate 24 have a cross-section in U-shape, the space between the horizontal plates 23a and 24a is left by the vertical plates 23b and 24b. For this reason, the space between the horizontal plates 23a and 24a are each more accurately left. This reduces dispersion of the capacitance value C3, and improves accuracy thereof.

While in the semiconductor device 21 the frame 23 and the conductive plate 24 are each composed of two horizontal plates 23a and 24a, respectively, the semiconductor device may be arranged by the frame and the conductive plate each having three or more plates.

Fourth Embodiment

Figure 7:
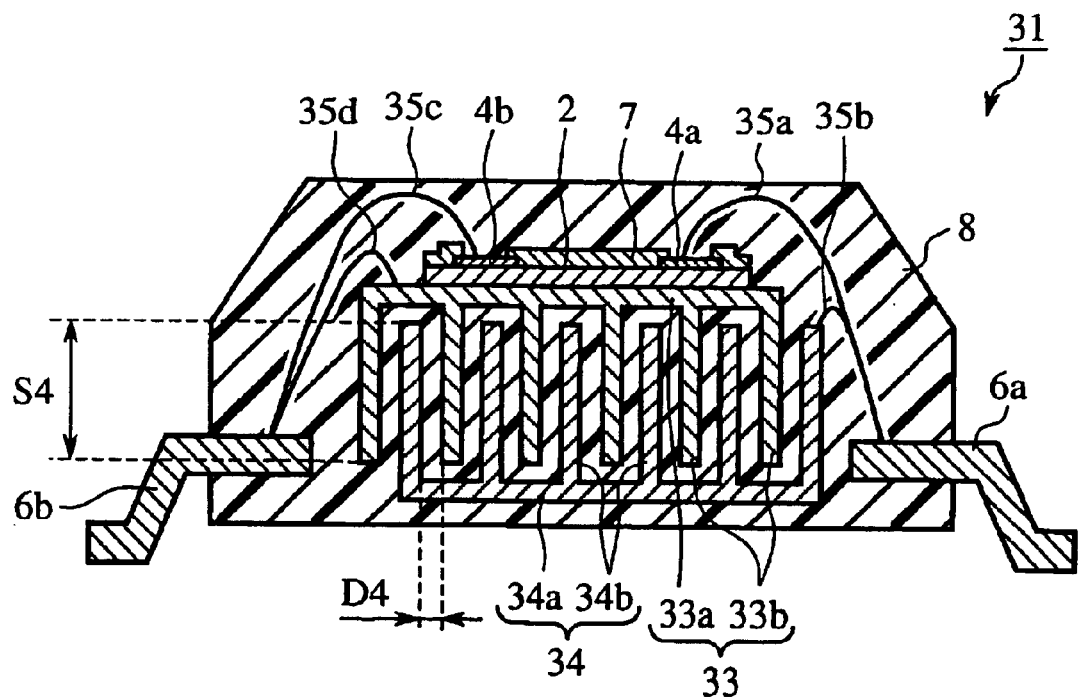
FIG. 7 is a sectional view showing the schematic configuration of the semiconductor device according to a fourth embodiment.

FIG. 7 is a sectional view showing the schematic configuration of the semiconductor device according to the fourth embodiment.

Referring to FIG. 7, reference numeral 31 denotes a semiconductor device, 33 denotes a frame on which IC chip 2 is mounted. The frame 33 has a cross section in comb-shape. Reference numeral 33a denotes one horizontal plate (hereinafter referred to as a horizontal plate) out of the frame 33, and 33b denote a plurality of vertical plates (hereinafter referred to as vertical plates) mated with the horizontal plate 33a. The vertical plates 33b are disposed each other in parallel at given intervals.

Reference numeral 34 denotes a conductive plate disposed in parallel at given intervals from the frame 33. The conductive plate 34 has a cross section in comb-shape similar to the frame 33. Reference numeral 34a denotes one horizontal plate (hereinafter referred to as a horizontal plate)

out of the conductive plate 34, and 34b denote a plurality of vertical plates (hereinafter referred to as vertical plates) mated with the horizontal plate 34a. The vertical plates 34b are disposed each other in parallel at given intervals.

Reference numerals 35a–35d denote bonding wires (hereinafter referred to as wires). The wire 35a connects pad 4a and external terminal 6a. The wire 35b connects the conductive plate 33a and the external terminal 6a. The wire 35c connects pad 4b and external terminal 6b. The wire 35d connects the frame 33 and the external terminal 6b.

Reference numeral D4 denotes the distance between the vertical plate 33b of the frame 33 and the vertical plate 34b of the conductive plate 34, disposed adjacent to each other. Reference numeral S4 denotes an area in which the vertical boards 33b of the frame 33 and the vertical boards 34b of the conductive board 34 are opposed to each other.

In the semiconductor device 31 arranged as mentioned above, because the portion of the molding compound 8, lying beneath the frame 33 and included in the area S4, serves as a dielectric layer, the portions of the frame 33, the conductive board 34, and the dielectric layers, included in this area S4 form a capacitor. Assuming that the total number of the vertical boards 33b and 34b is N and the dielectric constant of the molding compound 8 is $\rho$, the capacitance value C4 is expressed by the following formula (4):

$$\text{The capacitance value } C4=(N-1)\times\rho\times S4/D4 \quad (4)$$

The capacitance value C4 will serve as a bypass capacitor to reduce the noises of the power supply and as a capacitor to adjust the properties of the analog elements.

Because the other constituent elements are the same as that of the first embodiment, the detailed description thereof is omitted.

The conductive plate 34 is disposed at the predetermined position by various preferable methods. For instance, as with the first embodiment, the formation of the semiconductor device 31 using the preformed connective can simply produce the elaborated semiconductor device 31.

As mentioned above, through the semiconductor device 31 of the fourth embodiment, the capacitance value C4 is formed in the portion beneath the IC chip 2 within the semiconductor device 31. Moreover, in the process of encapsulating the IC chip 2 in the molding compound 8, the capacitance of the capacitance value C4 is formed. A part of the molding compound 8 itself serves as a dielectric layer. Therefore, the similar effect to that of the first embodiment is obtained.

Moreover, because the frame 33 and the conductive plate 34 have a cross section in comb-shape, spaces between the plurality of the boards 33b and 34b are left by the plates 33a and 34a. This becomes smaller the dispersion of the capacitance value C4, and thereby improves the accuracy thereof.

Fifth Embodiment

Figure 8:
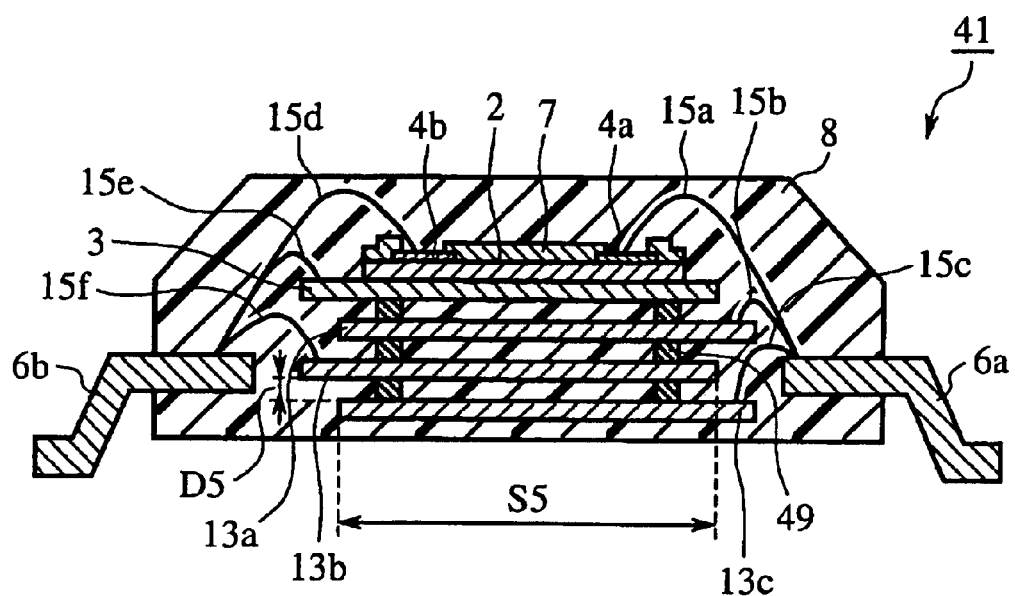
FIG. 8 is a sectional view showing the schematic configuration of the semiconductor device according to a fifth embodiment.
Figure 9:
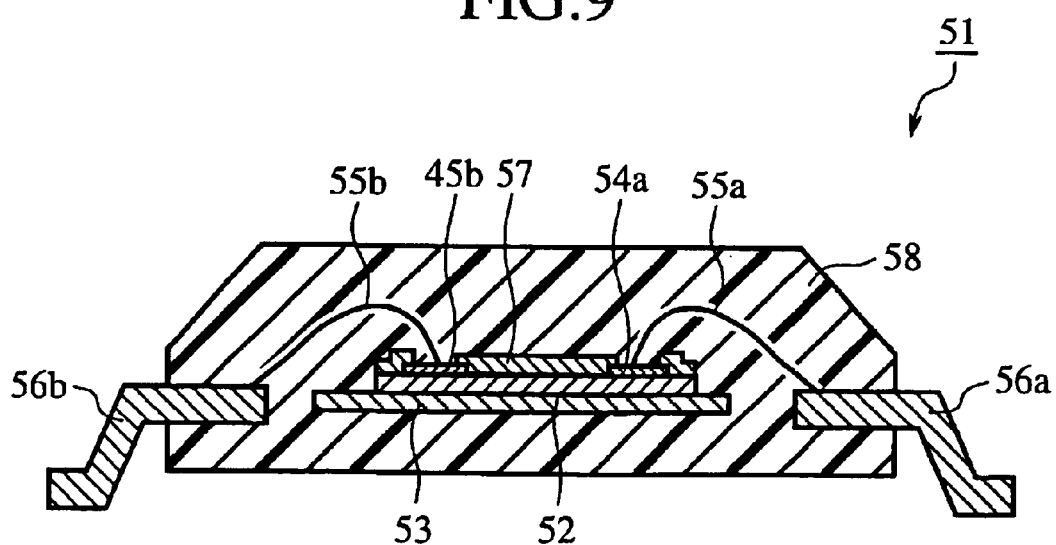
FIG. 9 is a sectional view showing the schematic configuration of a conventional semiconductor device.

FIG. 8 is a sectional view showing the schematic configuration of the semiconductor device 41 according to the fifth embodiment of the present invention.

The semiconductor device according to the fifth embodiment is one in which spacers 49 are inserted into the space between the frame 3 and the first conductive plate 13a and between the first to third conductive plates 13a–13c disposed adjacent to each other within the semiconductor device 11 according to the second embodiment.

Referring to FIG. 8, reference numeral 41 denotes a semiconductor device, 49 denotes spacers inserted into the spaces between the frame 3 and the first conductive plate 13a, and between the first to third conductive plates 13a–13c disposed adjacent to each other for leaving the spaces therebetween. The spacers are inserted into the four corners to leave the space. A wide variety of alternatives are given for choice of the material of the spacer 49. However, a proper material should be selected from the viewpoints of insulation properties, hardness for leaving the spaces between the plates, temperature and water resistances. For instance, hard compounds and plastics are preferable ones.

A wide variety of alternatives are given for choice of the installing method of the spacer 49. No matter which method one uses as long as it adopts proper mounting methods, such as bonding with adhesives or fitting by a fitting tool. The other constituent elements are the same as that of the first embodiment, the detailed description thereof is omitted.

As mentioned above, the semiconductor device 1 according to the fifth embodiment has similar configurations to that of the semiconductor device 11 of the second embodiment except the spacer 49, the similar effect to that of the second embodiment is obtained.

In addition, the provision of the spacers 49 for leaving the spaces between the frame 3 and the first conductive plate 13a, and between the first to third conductive plates 13a–13c disposed adjacent to each other reduces the dispersion of the capacitance value C2, and thereby improves the accuracy thereof.

While in the semiconductor device 41 according to the fifth embodiment, the spacer 49 is inserted into the semiconductor device 11 according to the second embodiment, it may be also inserted into the semiconductor device 1 according to the first embodiment. Additionally, the same may be also applied to the other semiconductor devices for leaving the spaces between the frame and conductive plates.

What is claimed is:

1. A semiconductor device comprising:
   a semiconductor element;
   a frame including at least two parallel plates and a transverse plate contacting the at least two parallel plates so that the frame has, in cross section, a U-shape, the semiconductor element being mounted on one of the parallel pates of the frame;
   a conductive plate including at least two parallel plates and a transverse plate contacting the at least two parallel plates, the at least two parallel plates of the frame and of the conductive plate being spaced from each other and interdigitated;
   external terminals electrically connected to the semiconductor element, the frame, and the conductive plate; and
   a molding compound covering and encapsulating the semiconductor element, the frame, and the conductive plate.

2. The semiconductor device according to claim 1, wherein the at least two parallel plates of the frame are rectangular, and the at least two parallel plates of the conductive plate are rectangular.

3. A semiconductor device comprising:
   a semiconductor element;
   a frame on which the semiconductor element is mounted;
   a conductive plate disposed on an opposite side of the frame from the semiconductor element, and spaced from the frame, wherein
   the frame and the conductive plate each include a plate having a comb-shape in cross section, including first plate and a plurality of transverse plates contacting the first plate, and the transverse plates of the frame and the transverse plates of the conductive plate are spaced from each other and interdigitated;

external terminals electrically connected to the semiconductor element, the frame, and the conductive plate; and a molding compound covering and encapsulating the semiconductor element the frame, and the conductive plate.

4. The semiconductor device according to claim 3, wherein the first plates and the transverse plates of the frame and the conductive plate are rectangular.

* * * * *